(12) United States Patent
Chien et al.

(10) Patent No.: US 10,596,641 B2
(45) Date of Patent: Mar. 24, 2020

(54) DRILL STRUCTURE

(71) Applicant: TCT GLOBAL LIMITED, New Territories (HK)

(72) Inventors: Sung-Hao Chien, Taoyuan Hsien (TW); Li-Yi Chao, Taoyuan Hsien (TW); Feng-Yu Lin, Taoyuan Hsien (TW); Ming-Yuan Zhao, Taoyuan Hsien (TW); Chun-Yu Chen, Taoyuan Hsien (TW)

(73) Assignee: TCT GLOBAL LIMITED, Hong Kong (CN)

( * ) Notice: Subject to any disclaimer, the term of this patent is extended or adjusted under 35 U.S.C. 154(b) by 95 days.

(21) Appl. No.: 15/411,371

(22) Filed: Jan. 20, 2017

(65) Prior Publication Data

US 2017/0209942 A1 Jul. 27, 2017

(30) Foreign Application Priority Data

Jan. 22, 2016 (TW) .............................. 105101987 A (51) Int. Cl.
*B23B 51/02* (2006.01)
*H05K 3/00* (2006.01)

(52) U.S. Cl.
CPC ........... *B23B 51/02* (2013.01); *H05K 3/0047* (2013.01); *B23B 2251/08* (2013.01);
(Continued)

(58) Field of Classification Search
CPC ........... Y10T 408/9097; Y10T 408/909; B23B 51/02; B23B 2251/08; B23B 2251/24;
(Continued)

(56) References Cited

U.S. PATENT DOCUMENTS 2,322,894 A * 6/1943 Stevens .................. B23B 51/02
408/230
2,646,701 A * 7/1953 Letien ..................... B23B 51/02
408/223
(Continued)

FOREIGN PATENT DOCUMENTS

CN 203045000 U 7/2013
CN 204053023 U 12/2014
(Continued)

*Primary Examiner* — Alan Snyder
*Assistant Examiner* — Yasir A Diab
(74) *Attorney, Agent, or Firm* — Muncy, Geissler, Olds & Lowe, PC (57) ABSTRACT

A drill structure includes a shank part and a flute part arranged on one end of the shank part. A chisel edge is formed on the front end of the flute part and two drill blades with tilt directions toward the shank part are symmetrically formed on the two sides of the chisel edge. Every drill blade includes: a primary relief surface with a cutting edge, a first connecting edge and a first chamfering edge, a secondary relief surface with a knife-back edge, a second connecting edge, a second chamfering edge and an outer edge, and an assist relief surface. The second connecting edge joins to the first connecting edge, and the second chamfering edge connects with the first chamfering edge. The assist relief surface, which tilts toward the shank part the, is extend from the first chamfering edge and the second chamfering edge. This drill structure can improve the surface finish of the drilling hole.

10 Claims, 6 Drawing Sheets

(52) U.S. Cl.
CPC ....... *B23B 2251/18* (2013.01); *B23B 2251/24* (2013.01); *B23B 2251/426* (2013.01)

(58) Field of Classification Search
CPC .......... B23B 2251/18; B23B 2251/426; B23B 2251/48
See application file for complete search history.

(56) References Cited

U.S. PATENT DOCUMENTS

| | | | | |
|---|---|---|---|---|
| 3,779,664 A | * | 12/1973 | Caley | B23B 51/02 408/225 |
| 4,116,580 A | * | 9/1978 | Hall | B23B 51/02 407/54 |
| 4,383,785 A | * | 5/1983 | Rice | B23B 51/02 125/20 |
| 4,561,813 A | * | 12/1985 | Schneider | B23B 51/02 408/228 |
| 4,759,667 A | * | 7/1988 | Brown | B23B 51/02 408/227 |
| 5,160,232 A | * | 11/1992 | Maier | B23B 51/02 407/54 |
| 5,174,691 A | * | 12/1992 | Shepley | B23B 51/02 408/1 R |
| 6,126,367 A | * | 10/2000 | Reed | B23B 51/02 408/1 R |
| 6,213,692 B1 | * | 4/2001 | Guehring | B23B 51/02 408/144 |
| 2014/0023448 A1 | * | 1/2014 | Yanagida | B23B 51/00 408/229 |
| 2014/0363249 A1 | | 12/2014 | Oka et al. | |
| 2017/0066062 A1 | * | 3/2017 | Takahashi | B23B 51/02 |

FOREIGN PATENT DOCUMENTS

| | | | | |
|---|---|---|---|---|
| CN | 204075317 U | | 1/2015 | |
| FR | 1352808 A | * | 2/1964 | ............ B23B 51/02 |
| JP | 2984446 B2 | | 11/1999 | |
| JP | 2014161946 A | * | 9/2014 | |
| TW | M485776 U | | 9/2014 | |
| TW | M489716 U | | 11/2014 | |
| TW | M513078 U | | 12/2015 | |

* cited by examiner

DRILL STRUCTURE

BACKGROUND OF THE INVENTION

1. Field of the Invention

The present invention relates to a drill structure, particularly to a drill structure suitable to be used in printed circuit boards.

2. Description of the Prior Art

Under the trend toward fabricating small, slim and lightweight electronic products, the elements of electronic products grow finer and finer. Thus, the printed circuit board (PCB) where the electronic elements are installed also becomes smaller and smaller. Therefore, the manufacturers require the micro drills used in PCB to have higher precision, strength, feed rate, and surface finish. In practical fabrication, the manufacturer is likely to stack a plurality of PCB's and drills them simultaneously so as to increase the fabrication efficiency and decrease the fabrication cost. In such a case, the micro drill needs to have longer length and sufficient chip discharge capability.

Figure 1:
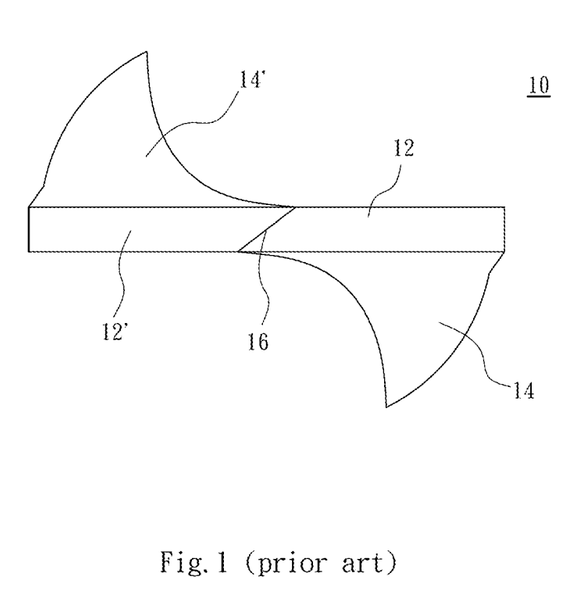
FIG. 1 schematically shows cutting faces of a traditional drill structure.

A conventional micro drill involves a shank part and a flute part connected with the shank part. The front end of the flute part has a cutting structure 10, as shown in FIG. 1. The cutting structure 10 includes two primary relief surfaces 12, 12' and two secondary relief surfaces 14, 14', which are symmetrically arranged with respect to a static tip point 16 and used to cut workpieces. In such a cutting structure 10, two primary relief surfaces 12, 12' and two secondary relief surfaces 14, 14' have a larger contact area with the board, which makes the cutting faces break easily, not only degrading the surface finish of the drilled holes but also shortening the service life of the drill.

SUMMARY OF THE INVENTION

In order to solve the abovementioned problems, one objective of the present invention is to propose a drill structure whose drill blades are chamfered to form assist relief surfaces, whereby is significantly decreased the contact area between the board and the cutting faces, wherefore the cutting faces are less likely to break and the surface finish of the drilled holes are greatly upgraded.

Another objective of the present invention is to propose a drill structure, wherein the assist cutting edge of the assist relief surfaces is continuous with the cutting edge of the primary relief surface to increase the cutting lines of the primary relief surface, whereby is enhanced the cutting ability in drilling holes and upgraded the surface finish of the drilled holed.

In order to achieve the abovementioned objectives, the drill structure includes a shank part and a flute part disposed at one end of the shank part. A chisel edge is formed on a front end of the flute part, and two drill blades with tilt directions toward the shank part are symmetrically formed on two sides of the chisel edge. Two helical cutting edges are respectively formed spirally on an outer surface of the flute part from outer edges of the drill blades to form two helical grooves. The two drill blades have a common edge at the chisel edge, and each of the drill blades includes a primary relief surface, a secondary relief surface and an assist relief surface. The primary relief surface has a cutting edge, a first connecting edge and a first chamfering edge, wherein the cutting edge and the first connecting edge are respectively extended from two opposite ends of the common edge; another end of the cutting edge and another end of the first connecting edge, which are far away from the common edge, are joined with the first chamfering edge and wherein the first chamfering edge is shaped as a linear line. The secondary relief surface has a knife-back edge, a second connecting edge, a second chamfering edge, and an outer edge of the secondary relief surface, wherein the second connecting edge is joined with the first connecting edge; one end of the second chamfering edge is connected with the second connecting edge and the first chamfering edge of the primary relief surface; another end of the second chamfering edge is connected with the outer edge of the secondary relief surface. The assist relief surface extends from the first chamfering edge with a linear line shape of said primary relief surface and the second chamfering edge of the secondary relief surface and tilted toward said shank part.

In one embodiment, two assist relief surfaces are formed via chamfering the opposite corners of two drill blades; the central axis of the flute part and each of the assist relief surfaces that are tilted toward the shank part have an included angle ranging from 10 to 85 degrees; the assist relief surface includes an assist cutting edge and a peripheral edge; the assist cutting edge succeeds to the cutting edge of the primary relief surface.

In one embodiment, a first spacing exists between two first chamfering edges of two primary relief surfaces; a second spacing exists between two peripheral edges of two assist relief surfaces; the first spacing is smaller than the second spacing; the ratio of the first spacing to the second spacing is 30-95%.

In one embodiment, two knife-back edges of two secondary relief surfaces are respectively extended from two opposite ends of the common edge; one end of the knife-back edge, which is far away from the common edge, is connected with the outer edge of the secondary relief surface; each of the primary relief surfaces is gradually widened from the chisel edge to the outer edge of said drill blade.

In one embodiment, a portion of the cutting edge of the primary relief surface of one drill blade, which is adjacent to the chisel edge, and a portion of the knife-back edge of the secondary relief surface of another drill blade, which is adjacent to the chisel edge, jointly form a primary groove, which is extended to the helical groove; a secondary groove is formed in a middle section of each cutting edge.

In one embodiment, the chisel edge of two drill blades is formed via joining first edges of two primary relief surfaces and second edges of two secondary relief surfaces.

In one embodiment, two drill blades that are respectively disposed on two sides of the chisel edge include a drill tip angle ranging from 120 to 185 degrees.

In one embodiment, the outer diameter of the shank part ranges from 3.17 to 3.18 mm; the outer diameter of the flute part ranges from 0.075 to 3.175 mm or ranges from 3.175 to 6.5 mm.

Below, embodiments are described in detail in cooperation with attached drawings to make easily understood the objectives, technical contents, characteristics and accomplishments of the present invention.

DESCRIPTION OF THE PREFERRED EMBODIMENTS

Figure 2:
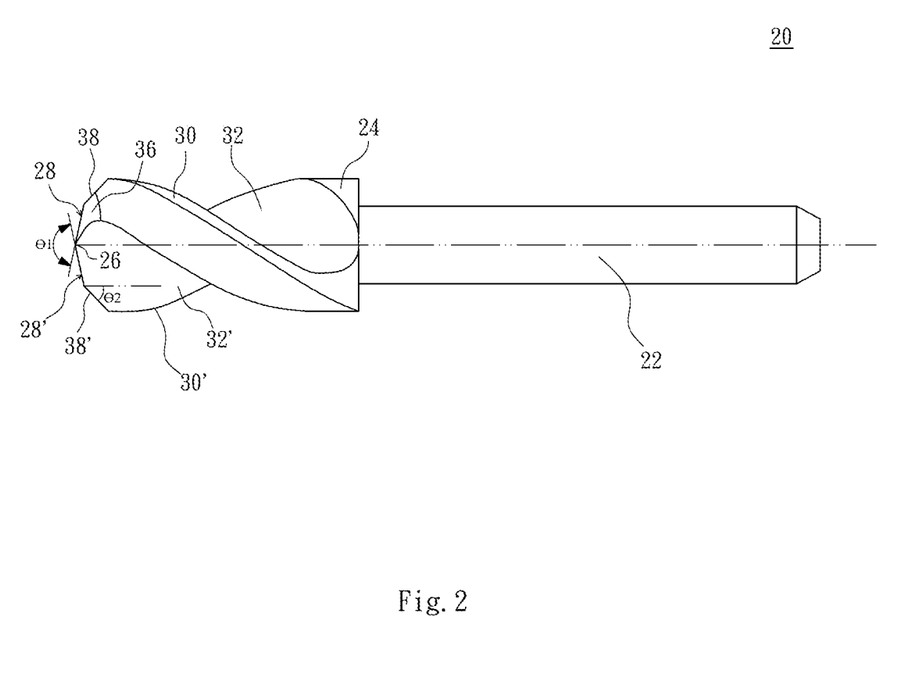
FIG. 2 schematically shows a drill structure according to one embodiment of the present invention.
Figure 3:
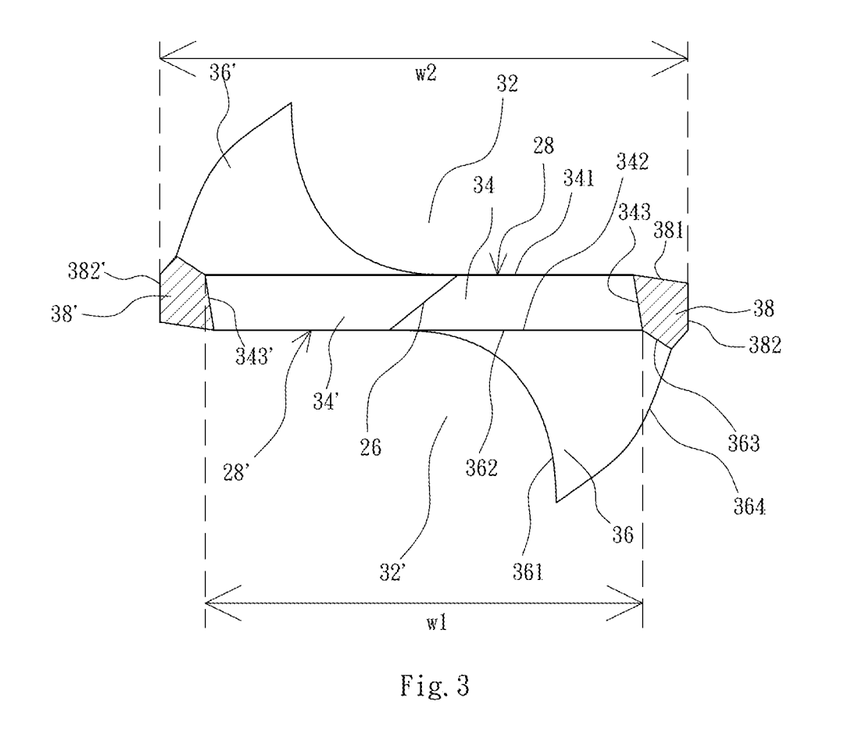
FIG. 3 is a top view schematically showing an end of a drill structure according to a first embodiment of the present invention

FIG. 2 is a diagram schematically showing a drill structure according to one embodiment of the present invention. As shown in FIG. 2, the drill structure 20 comprises a shank part 22 and a flute part 24 disposed at one end of the shank part 22. A chisel edge 26 is formed on a front end of the flute part 24, and two drill blades 28, 28' with tilt directions toward the shank part 22 are symmetrically formed on two sides of the chisel edge 26. Two helical cutting edges 30, 30' are respectively formed spirally on the outer surface of the flute part 24 from outer edges of the drill blades 28, 28' to form two helical grooves 32, 32'. FIG. 3 is a top view of an end of a drill structure according to a first embodiment of the present invention. As shown in FIG. 3, two drill blades 28, 28' has a common edge at the chisel edge 26; each of the drill blades 28, 28' has a primary relief surface 34 or 34', a secondary relief surface 36 or 36' and an assist relief surface 38 or 38'.

Below, the primary relief surface 34, the secondary relief surface 36, and the assist relief surface 38 of the drill blade 28 are used to demonstrate the characteristics of the present invention, which the primary relief surface 34', the secondary relief surface 36', and the assist relief surface 38' of the drill blade 28' also possess. The primary relief surface 34 includes a cutting edge 341, a first connecting edge 342 and a first chamfering edge 343. The cutting edge 341 and the first connecting edge 342 are respectively extended from two opposite ends of the chisel edge 26, i.e. the common edge of the drill blades 28 and 28'. Another end of the cutting edge 341 and another end of the first connecting edge 342, which are far away from the chisel edge 26, are joined with the first chamfering edge 343. In one embodiment, the cutting edge 341 and the first connecting edge 342 are opposite and parallel. The secondary relief surface 36 includes a knife-back edge 361, a second connecting edge 362, a second chamfering edge 363, and an outer edge 364 of the secondary relief surface 36. The second connecting edge 362 is joined with the first connecting edge 342. The knife-back edges 361, 361' of the secondary relief surfaces 36, 36' are respectively extended from two opposite ends of the chisel edge 26. One end of the second chamfering edge 363 is connected with the second connecting edge 362 and intersects with the first chamfering edge 343 of the primary relief surface 34. Another end of the second chamfering edge 363 is connected with one end of the outer edge 364 of the secondary relief surface 36. Another end of the outer edge 364 of the secondary relief surface 36 is connected with one end of the knife-back edge 361, which is far away from the chisel edge 26. The assist relief surface 38 is extended from the first chamfering edge 343 of the primary relief surface 34 and the second chamfering edge 363 of the secondary relief surface 36 and tilted toward the shank part 22, as shown in FIG. 2. In one embodiment, the assist relief surface 38 includes an assist cutting edge 381 and a peripheral edge 382, wherein the assist cutting edge 381 succeeds to the cutting edge 341 of the primary relief surface 34.

Figure 4:
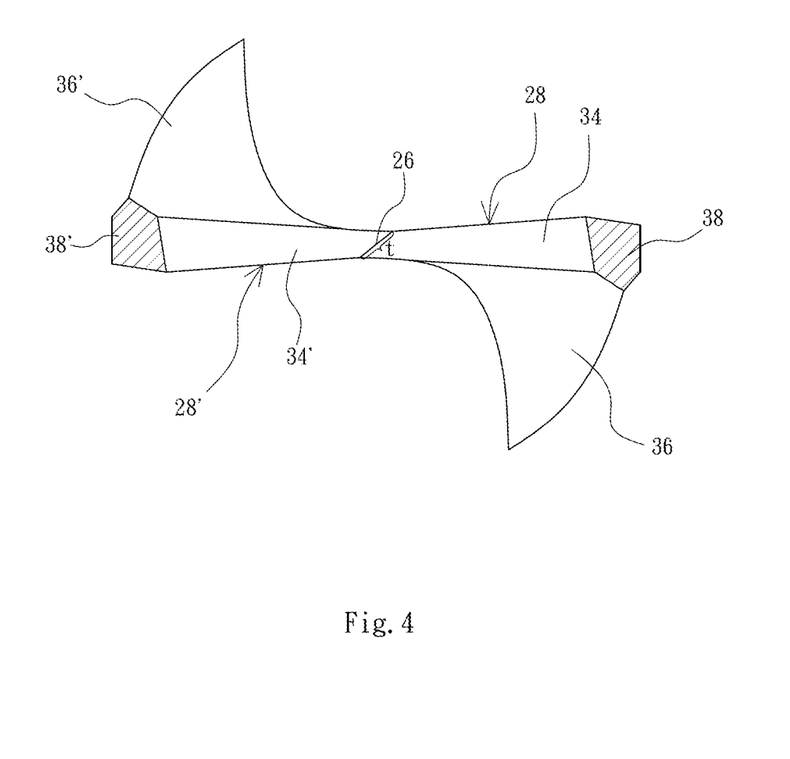
FIG. 4 is a top view schematically showing an end of a drill structure according to a second embodiment of the present invention.

Refer to FIG. 4 a top view of an end of a drill structure according to a second embodiment of the present invention. As shown in FIG. 4, two drill blades 28, 28' with tilt directions toward the shank part 22 (shown in FIG. 2) are symmetrically formed on two sides of the chisel edge 26. Each of the drill blades 28, 28' includes a primary relief surface 34 or 34', a secondary relief surface 36 or 36' and an assist relief surface 38 or 38'. The second embodiment is different from the first embodiment in that each of the primary relief surfaces 34, 34' is gradually widened from the chisel edge 26 to the outer edge of the drill blade to present a fan-like structure. In other words, each of the drill blades 28, 28' of the second embodiment has a smaller thickness t in the chisel edge 26 than that of the first embodiment. Thus is decreased the resistance in drilling and increased the service life of the flute part 24 (shown in FIG. 2).

Figure 5:
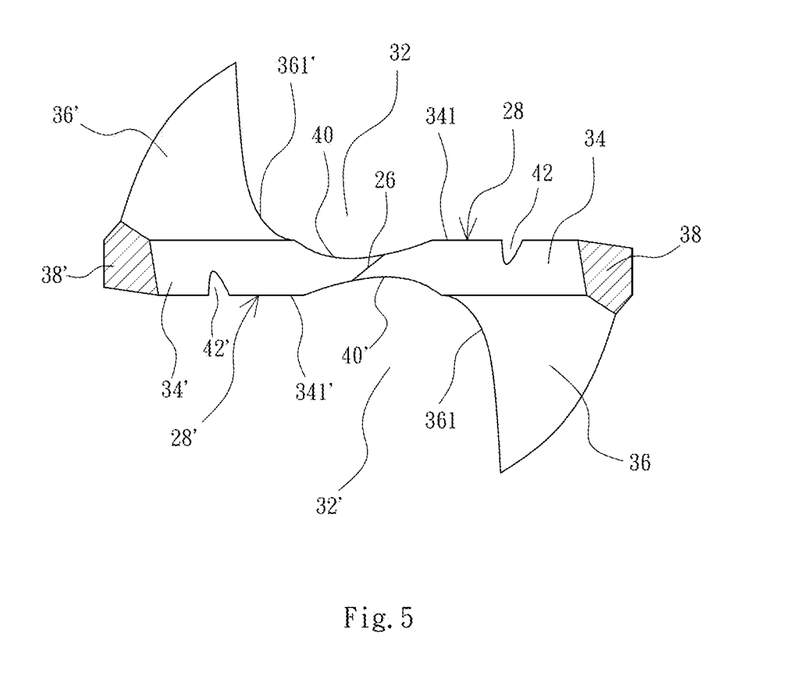
FIG. 5 is a top view schematically showing an end of a drill structure according to a third embodiment of the present invention.

Refer to FIG. 5 a top view of an end of a drill structure according to a third embodiment of the present invention. As shown in FIG. 5, two drill blades 28, 28' with tilt directions toward the shank part 22 (shown in FIG. 2) are symmetrically formed on two sides of the chisel edge 26. Each of the drill blades 28, 28' includes a primary relief surface 34 or 34', a secondary relief surface 36 or 36' and an assist relief surface 38 or 38'. In the third embodiment, a portion of the cutting edge 341 of the primary relief surface 34, which is adjacent to the chisel edge 26, and a portion of the knife-back edge 361' of the secondary relief surface 36', which is adjacent to the chisel edge 26, jointly form a primary groove 40, which is extended to the helical groove 32; a portion of the cutting edge 341' of the primary relief surface 34', which is adjacent to the chisel edge 26, and a portion of the knife-back edge 361 of the secondary relief surface 36, which is adjacent to the chisel edge 26, jointly form a primary groove 40', which is extended to the helical groove 32'; further, a secondary groove 42 or 42' is formed in the middle section of the cutting edge 341 or 341'. In the design of forming the primary grooves 40, 40' and the secondary grooves 42, 42' on the cutting faces, the discontinuous cutting lines can further decrease the size of the cutting chips lest the cutting chips agglomerate and adhere to the terminal of the flute part. Thus is enhanced the surface finish of the drilled holes.

Figure 6:
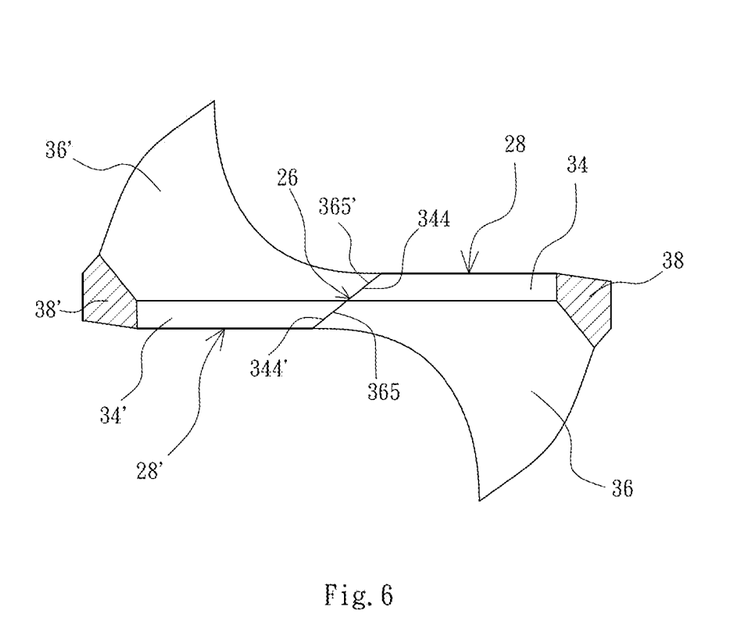
FIG. 6 is a top view schematically showing an end of a drill structure according to a fourth embodiment of the present invention.

Refer to FIG. 6 a top view of an end of a drill structure according to a fourth embodiment of the present invention. As shown in FIG. 6, two drill blades 28, 28' with tilt directions toward the shank part 22 (shown in FIG. 2) are symmetrically formed on two sides of the chisel edge 26. Each of the drill blades 28, 28' includes a primary relief surface 34 or 34', a secondary relief surface 36 or 36' and an assist relief surface 38 or 38'. The fourth embodiment is different from the first embodiment in that the chisel edge 26 is formed via joining first edges 344, 344' of the primary relief surfaces 34, 34' and second edges 365, 365' of the secondary relief surfaces 36, 36'.

In the abovementioned first, second, third and fourth embodiments, two assist relief surfaces 38, 38' are formed via chamfering the opposite corners of two drill blades 28, 28', whereby the assist relief surfaces 38 is formed in the junction of the primary relief surface 34 and the secondary relief surface 36, and the assist relief surfaces 38' is formed in the junction of the primary relief surfaces 34' and the secondary relief surfaces 36'. For an exemplification, in the drill blades 28, 28' of the first embodiment shown in FIG. 3, a first spacing w1 exists between the first chamfering edges 343, 343' of the primary relief surfaces 34, 34'; a second spacing w2 exists between the peripheral edges 382, 382' of the assist relief surfaces 38, 38'; the first spacing w1 is smaller than the second spacing w2; the ratio of the first spacing w1 to the second spacing w2 is 30-95%, preferably 90%.

Refer to FIG. 2 again. Two drill blades 28, 28' that are respectively disposed on two sides of the chisel edge 26 include a drill tip angle θ1 ranging from 120 to 185 degrees. The assist relief surfaces 38, 38' are formed via chamfering the opposite corners of two drill blades 28, 28', tilted toward the shank part 22; the central axis of the flute part 24 and each of the assist relief surfaces 38, 38' have an included angle θ2 ranging from 15 to 85 degrees. The outer diameter of the shank part 22 ranges from 3.17 to 3.18 mm. The outer diameter of the flute part 24 ranges from 0.075 to 3.175 mm or ranges from 3.175 to 6.5 mm.

In the present invention, the design of chamfering the drill blades to form the assist relief surfaces can effectively decrease the contact area between the cutting faces and the board, whereby the cutting faces are less likely to break and the surface finish of the drilled holes is significantly enhanced. Further, the continuation of the cutting edges of the assist relief surfaces to the cutting edges of the primary relief surfaces can increase the cutting lines of the primary relief surfaces, enhance the drilling ability in drilling, and improve the surface finish of the drilled holes.

Although the present invention has been explained in relation to its preferred embodiment, it is to be understood that other modifications and variation can be made without departing the spirit and scope of the invention as hereafter claimed.

What is claimed is:

1. A drill structure comprising
   a shank part; and
   a flute part disposed at one end of said shank part, wherein a chisel edge is formed on a front end of said flute part, and two drill blades with tilt directions toward said shank part are symmetrically formed on two sides of said chisel edge; two helical cutting edges are respectively formed spirally on an outer surface of said flute part from outer edges of said drill blades to form two helical grooves; two said drill blades have a common edge at said chisel edge, and wherein each of said drill blades includes
   a primary relief surface having a cutting edge, a first connecting edge and a first chamfering edge, wherein said cutting edge and said first connecting edge are respectively extended from two opposite ends of said common edge; another end of said cutting edge and another end of said first connecting edge, which are far away from said common edge, are joined with said first chamfering edge, wherein the first chamfering edge is shaped as a linear line;
   a secondary relief surface having a knife-back edge, a second connecting edge, a second chamfering edge, and an outer edge of said secondary relief surface, wherein said second connecting edge is joined with said first connecting edge; one end of said second chamfering edge is connected with said second connecting edge and said first chamfering edge of said primary relief surface; another end of said second chamfering edge is connected with said outer edge of said secondary relief surface; and
   an assist relief surface extended from said first chamfering edge with linear line shape of said primary relief surface and said second chamfering edge of said secondary relief surface and tilted toward said shank part, said assist relief surface includes an assist cutting edge, only said assist cutting edge touches a drilled hole wall to reduce friction and overheating;
   wherein said two drill blades converge by the primary relief surfaces thereof at said chisel edge as a linear line, but the convergence of both the primary and secondary relief surfaces at the chisel edge is precluded.

2. The drill structure according to claim 1, wherein said assist relief surface includes a peripheral edge; said assist cutting edge succeeds to said cutting edge of said primary relief surface.

3. The drill structure according to claim 2, wherein a first spacing exists between said first chamfering edges of said primary relief surfaces; a second spacing exists between said peripheral edges of said assist relief surfaces; said first spacing is smaller than said second spacing; a ratio of said first spacing to said second spacing is 30-95%.

4. The drill structure according to claim 1, wherein two said knife-back edges of said secondary relief surfaces are respectively extended from two opposite ends of said chisel edge; one end of said knife-back edge, which is far away from said chisel edge, is connected with said outer edge of said secondary relief surface.

5. The drill structure according to claim 4, wherein each of said primary relief surfaces is gradually widened from said chisel edge to said outer edge of said drill blade.

6. The drill structure according to claim 4, wherein a portion of said cutting edge of one said drill blade, which is adjacent to said chisel edge, and a portion of said knife-back edge of another said drill blade, which is adjacent to said chisel edge, jointly form a primary groove, which is extended to said helical groove; a secondary groove is formed in a middle section of each of said cutting edges.

7. The drill structure according to claim 1, wherein said chisel edge is formed via joining first edge of said primary relief surface and second edge of said secondary relief surface.

8. The drill structure according to claim 1, wherein a central axis of said flute part and each of said assist relief surfaces that are tilted toward said shank part have an included angle ranging from 15 to 85 degrees; two said drill blades that are respectively disposed on two sides of said chisel edge include a drill tip angle ranging from 120 to 185 degrees.

9. The drill structure according to claim 1, wherein two said assist relief surfaces are formed via chamfering two opposite corners of two said drill blades.

10. The drill structure according to claim 1, wherein an outer diameter of said shank part ranges from 3.17 to 3.18 mm; an outer diameter of said flute part ranges from 0.075 to 3.175 mm or ranges from 3.175 to 6.5 mm.

* * * * *